(12) United States Patent
Sauter et al.

(10) Patent No.: US 9,875,956 B1
(45) Date of Patent: Jan. 23, 2018

(54) INTEGRATED INTERFACE STRUCTURE

(71) Applicant: GLOBALFOUNDRIES INC., Grand Cayman (KY)

(72) Inventors: Wolfgang Sauter, Burke, VT (US); Mark W. Kuemerle, Essex Junction, VT (US); Daniel P. Greenberg, Wake Forest, NC (US); Eric W. Tremble, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/276,182

(22) Filed: Sep. 26, 2016

(51) Int. Cl.
*H01L 23/52* (2006.01)
*H01L 23/498* (2006.01)
*H01L 23/66* (2006.01)
*H01L 25/065* (2006.01)
*H01L 23/00* (2006.01)

(52) U.S. Cl.
CPC .. *H01L 23/49816* (2013.01); *H01L 23/49838* (2013.01); *H01L 23/66* (2013.01); *H01L 24/04* (2013.01); *H01L 24/14* (2013.01); *H01L 25/0657* (2013.01); *H01L 2223/6644* (2013.01); *H01L 2223/6688* (2013.01); *H01L 2224/0401* (2013.01); *H01L 2224/1403* (2013.01); *H01L 2224/14051* (2013.01); *H01L 2224/14131* (2013.01); *H01L 2224/14134* (2013.01); *H01L 2224/14177* (2013.01); *H01L 2225/06513* (2013.01); *H01L 2225/06517* (2013.01)

(58) Field of Classification Search
USPC .......................................... 257/737
See application file for complete search history.

(56) References Cited

U.S. PATENT DOCUMENTS 8,510,487 B2   8/2013  Ruberg et al.
9,653,428 B1 * 5/2017  Hiner ................. H01L 25/0655

\* cited by examiner

*Primary Examiner* — Luan C Thai
(74) *Attorney, Agent, or Firm* — David Cain; Andrew M. Calderon; Roberts Mlotkowski Safran Cole & Calderon, P.C.

(57) ABSTRACT

The present disclosure relates to interface structures and, more particularly, to integrated interface structures with both parallel and serial interfaces and methods of manufacture. The integrated interface structure includes: a substrate; a plurality of serial interface connections integrated on the substrate; and a plurality of parallel interface connections on the integrated substrate and within spaces between sets of the plurality of serial interface connections.

20 Claims, 4 Drawing Sheets

INTEGRATED INTERFACE STRUCTURE

FIELD OF THE INVENTION

The present disclosure relates to interface structures and, more particularly, to integrated interface structures with both parallel and serial interface connections and methods of manufacture.

BACKGROUND

In general, there are two types of interface connections: serial interface connections (i.e., SERDES (Serializer/Deserializer configurations)) and parallel interface connections. The serial interface connection is the current standard for communication between chips through substrates or boards, providing medium to long distance, high frequency signals. The parallel interface connections, on the other hand, are used for large number of very short, low frequency signals. For example, base-station architecture can benefit from a low power parallel interface as it can provide lowest power dataconverter integration, amongst other benefits.

There is a movement in the industry to reduce the amount of power used for signal connections. There is also a need to continuously increase the amount of bandwidth between chips; however, bandwidth is limited by amount of available chip edge. Current interface technologies, though, cannot accommodate both reduced power usage and increased high bandwidth between chips.

SUMMARY

In an aspect of the disclosure, an integrated interface structure comprises: a substrate; a plurality of serial interface connections integrated on the substrate; and a plurality of parallel interface connections integrated on the substrate and within spaces between sets of the plurality of serial interface connections.

In an aspect of the disclosure, an interposer comprises: a substrate; and a plurality of serial interface connections integrated on the substrate and alternating with a plurality of parallel interface connections integrated on the substrate. The plurality of serial interface connections are structured to serially connect modules provided on different substrates, and the plurality of parallel interface connections are structured to connect, in parallel, modules provided on a same substrate.

In an aspect of the disclosure, an interposer comprises: a substrate; a plurality of serial interface connections integrated on the substrate which are structured to serially connect modules on different substrates; and a plurality of parallel interface connections integrated on the substrate and arranged in an alternating arrangement within spaces formed between the plurality of serial interface connections, and structured to connect, in parallel, components on the substrate. The plurality of parallel interface connections and the plurality of serial interface connections are structured to accommodate simultaneously integration of 2-dimensional (2D) assemblies, 2.5-dimensional (2.5D) assemblies and 3-dimensional (3D) assemblies.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to interface structures and, more particularly, to integrated interface structures with serial and parallel interface connections and methods of manufacture. More specifically, the present disclosure is directed to a single, integrated interface which can be implemented with multiple target applications including both high bandwidth assemblies (e.g., many channels operating at high speed) and low power assemblies (e.g., very power constrained environment). That is, advantageously, the present disclosure provides an integrated interface with both parallel and serial interfaces that can support multiple modes of assembly including, for example, the integration of 2-dimensional (2D) assemblies, 2.5-dimensional (2.5D) assemblies and 3-dimensional (3D) assemblies, thus enabling integration of several chips on a substrate and new system architectures.

Accordingly, by implementing the designs/structures discussed herein, it is now possible to integrate content that is not currently on a conventional module, e.g., data converters, stacked memory replacing off chip or on chip large memories, while saving power, system cost and adopting new technologies for dimensions that scale such as high active power logic (Digital Signal Processing). By way of example, by implementing the integrated interface with both parallel and serial interfaces it is now possible to bridge to a massive bandwidth parallel interface for cache coherency on 2.5D integration.

In more specific embodiments, the integrated interface structure described herein can operate with two (2) interface modes, i.e., parallel interface mode and serial interface mode, thereby accommodating different assemblies, while providing low die size overhead and significant signaling power benefit. For example, in embodiments, the parallel mode enables lower power solutions (e.g., lowest possible interconnect power) while still accommodating communication for low to medium bandwidth applications; whereas, the serial mode enables backwards-compatibility with a serial interface. In this way, it is now possible to have a dual mode interface communicating with differentiated packaging technologies, e.g., parallel interfaces used with assembly technologies such as high density laminates, silicon interposers and 3D integration and serial interfaces used with assembly technologies such as standard C4 technologies and organic substrates. Also, the integrated interface described herein can drive new architectures while maintaining SERDES based connectivity for legacy systems and maintaining the use of an Si interposer where bandwidth requirements justify it, e.g., 400-500 Gbps total bandwidth, HBM or HMC integration, while still integrating other components which would benefit from parallel communication.

Figure 1:
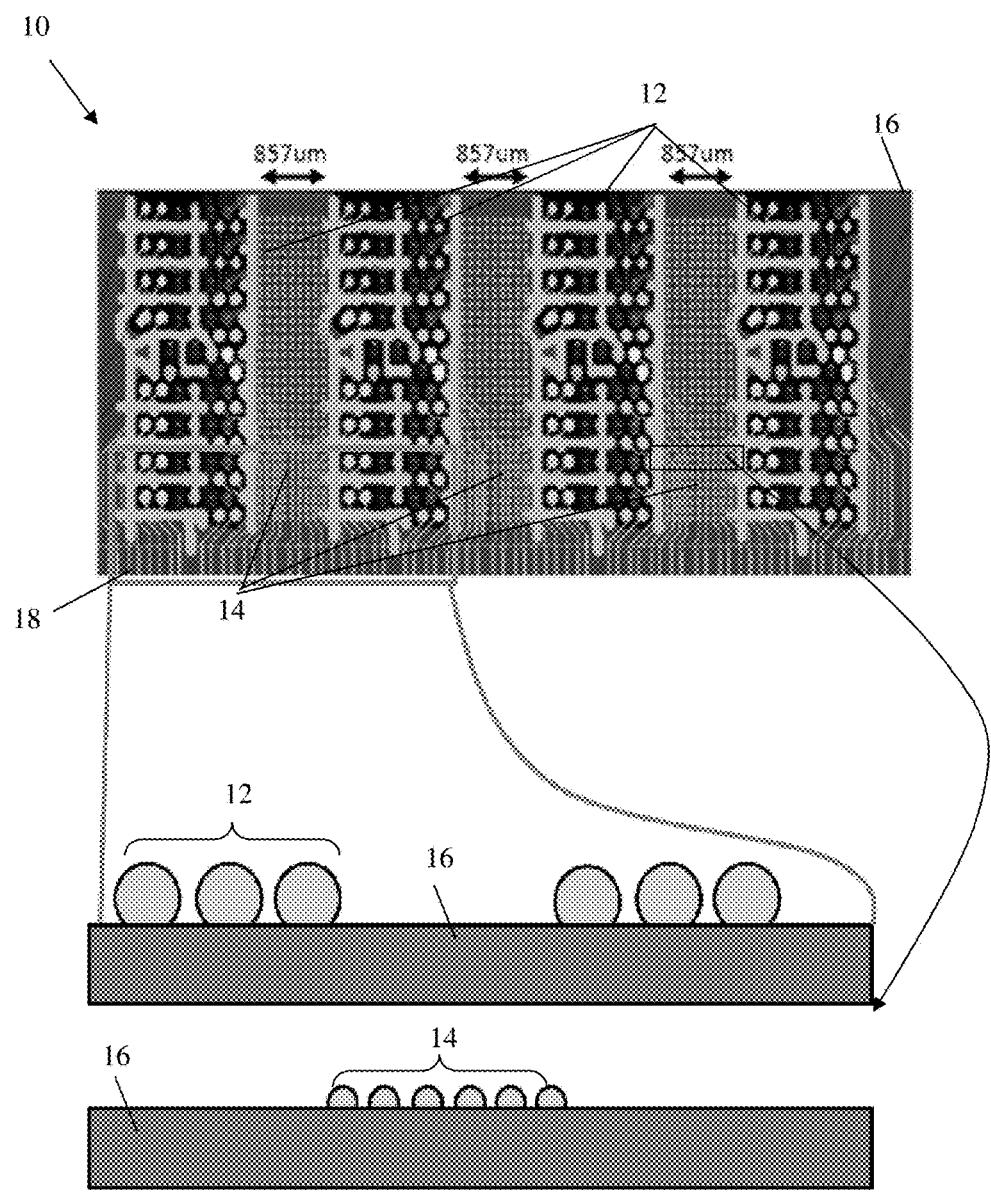
FIG. 1 shows an integrated interface structure in accordance with aspects of the present disclosure.

FIG. 1 shows an integrated interface structure in accordance with aspects of the present disclosure. More specifically, the integrated interface structure 10 includes a plurality of serial interface connections 12 and a plurality of parallel interface connections 14 formed or integrated on a same substrate or interposer 16 (e.g., die). The plurality of parallel interface connections 14 are provided between the plurality of serial interface connections 12 such that sets of the plurality of serial interface connections 12 alternate with sets of the plurality of parallel interface connections 14. Thus, and advantageously, the plurality of parallel interface connections 14 can be accommodated on previously unused chip space resulting in no need for additional chip area. In embodiments, the substrate or interposer 16 can be a standard laminate, silicon interposer, or 3D chip stack.

Still referring to FIG. 1, the plurality of serial interface connections 12 can be landing pads for solder bumps. For example, the plurality of serial interface connections 12 can be landing pads for C4 (Controlled Collapse Chip Connection) bumps. In more specific examples, the plurality of serial interface connections 12 can be Serializer/Deserializer (SERDES configurations) which are pairs of functional blocks commonly used in high speed communications to compensate for limited input/output. The serial interface connections 12 can be connected to pins 18, e.g., I/O pins, for serial interface to other components (e.g., module to module connections) of different module assemblies on different substrates.

The parallel interface connections 14, on the other hand, can be composed of a plurality of pillar I/O pins or fine pitched C4 bumps, as examples. The pillar I/O pins 14 can be copper pillars formed using conventional metal deposition, lithography and etching (reactive ion etching (RIE)) processes as is well known to those of skill in the art such that no further explanation is required herein. In embodiments, the fine pitched C4 bumps can be provided between the plurality of serial interface connections 12 or at the edge of the substrate 16; whereas, the copper pillar I/O pins are preferably formed in spaces between the plurality of serial interface connections 12. In embodiments, the spaces between the plurality of serial interface connections 12 can be approximately 857 microns; although other dimensions are also contemplated herein.

Figure 2A:
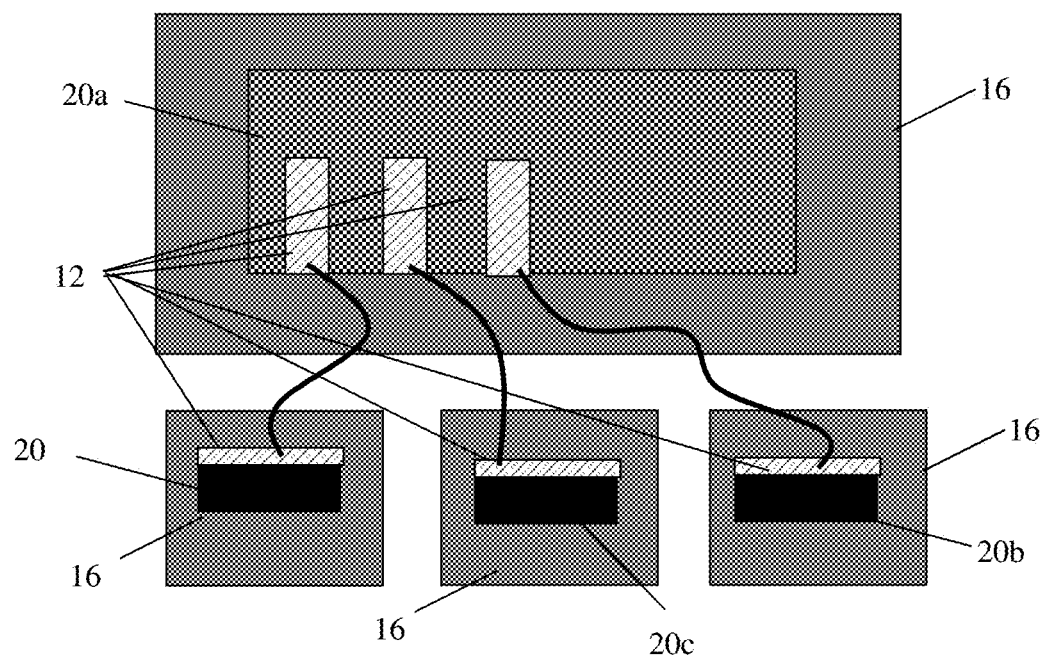
FIG. 2A shows the integrated interface structure in a serial interface mode in accordance with aspects of the present disclosure.

FIG. 2A shows the integrated interface structure in a serial interface mode in accordance with aspects of the present disclosure. As shown in FIG. 2A, the serial interface connections 12 connect modules 20, 20a, 20b, 20c provided on different substrates 16. In this way, the serial interface connections 12 can connect together different module assemblies. In embodiments, the serial interface connections 12 accommodate a high speed serial connection provided between, for example, a digital to analog converter or analog to digital converter or other components of different module assemblies.

Figure 2B:
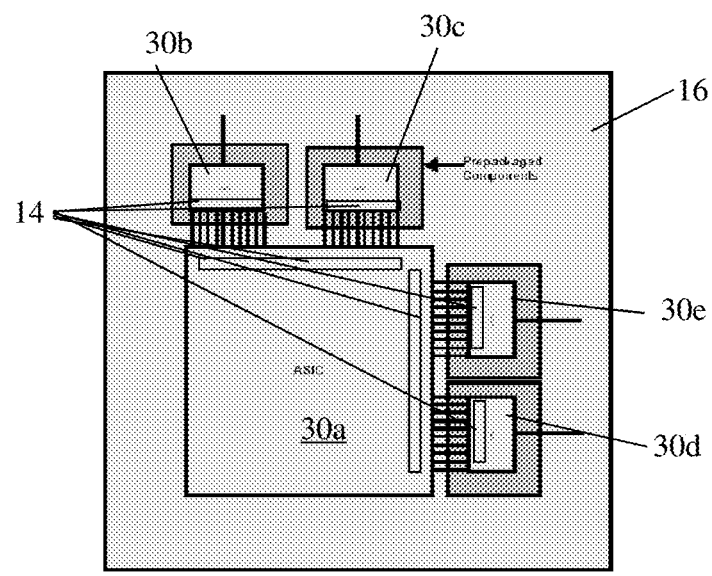
FIG. 2B shows the integrated interface structure in a parallel interface mode in accordance with aspects of the present disclosure.

FIG. 2B shows the integrated interface structure in a parallel interface mode in accordance with aspects of the present disclosure. As shown in FIG. 2B, the parallel interface connections 14 connect modules 30a-30e provided on a same substrate 16. In embodiments, the parallel interface connections 14 accommodate both ASIC 30a and other component designs 30b-30e. These component designs can be, e.g., different dataconverter technologies (without the need to change ASIC design).

By way of example, the parallel interface connections 14 can accommodate parallel dataconverter interfaces, e.g., support approximately 500 Gbps bandwidth for dataconverters with approximately 1 mm chip edge. The parallel interface connections 14 can also redistribute approximately 1 mm pitches to C4s as well as accommodate flexible C4 pitch, e.g., pitch 720 (width 360), pitch 360 (width 180), pitch 128 (width 64), etc. Moreover, the parallel interface connections 14 can accommodate fine lines and spaces while improving Gbps/mm of C4 space, as another illustrative example. In addition, by implementing the parallel interface connections 14, stacked memory (HMC/HBM) can replace external components and on-die dSRAM, resulting in low latency and higher bandwidth.

Figure 2C:
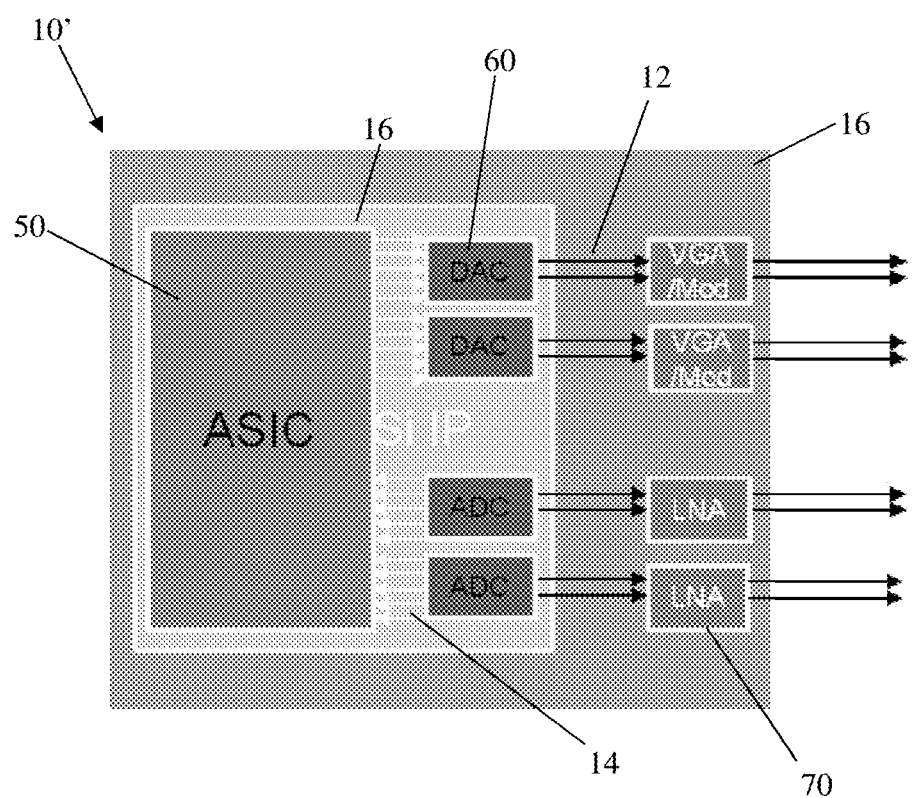
FIG. 2C shows the integrated interface structure in a mixed interface mode in accordance with aspects of the present disclosure.

FIG. 2C shows the integrated interface structure in a mixed interface mode in accordance with aspects of the present disclosure. More specifically, FIG. 2C shows a mixed interface configuration 10' in which multiple system solutions are possible with one ASIC die 50. As shown in this representative figure, a single chip solution is possible with external data converters 60 and analog components 70 connected with both parallel connections 14 and serial connections 12.

Figure 3:
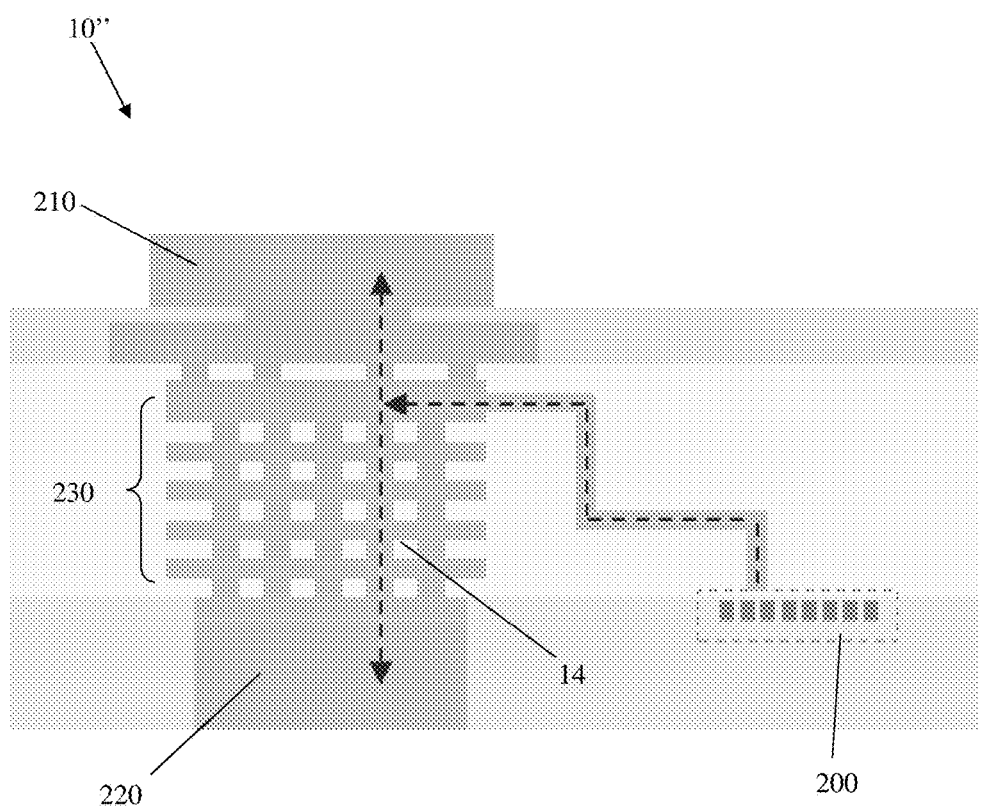
FIG. 3 shows the integrated interface structure in a mixed interface mode in accordance with aspects of the present disclosure.

FIG. 3 shows the integrated interface structure in a mixed interface mode in accordance with aspects of the present disclosure. In particular, the structure 10" of FIG. 3 shows an I/O circuit 200 wired to both a micropillar 210 and TSV 220 through a back end of the line (BEOL) column 230, enabling 2.5 D and 3 D components with the same design. As should be understood, the 3 D configuration keeps memory central to design floorplan and frees up edge area for SERDES integration; whereas, the 2.5 D configuration can use standard HBM style of integration on the die edge.

Accordingly, it should now be understood that the parallel interface structure can be used with differentiated packaging technologies to enable a dual mode interface that can communicate through serial, as well as parallel signaling. This results in many benefits including, for example, use of a parallel interface for highest bandwidth/chip edge and lowest power signaling. In addition, the serial interface provides the benefit of commonality with existing components, reuse in multiple, existing systems, longer reach solution, where needed, and risk reduction during implementation.

The packaging interconnect approach described herein also enables an interface core that can be used in either a parallel or serial way to allow maximum flexibility, maximum bandwidth and lowest power, with little to no area increase. It is also possible to replace onboard SERDES with bandwidth dense alternatives, allowing integration of components with different data rates thereby reaching capability based on system configuration. In addition, the packaging interconnect approach described herein provides the opportunity to connect components on an interposer for systems that need power efficiency and compact form factor, and build different solutions for different systems with a change of packaging rather than new silicon resulting in significant cost savings. For example, by implementing the packaging interconnect approach described herein, it is now possible to move away from bulky optics located far away from logic components to a highly-integrated optics close to the logic chips. Also, it is now possible to upgrade ASIC to new technology for power benefit without converter redesign.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An integrated interface structure comprising:
   a substrate;
   a plurality of serial interface connections integrated on the substrate and structured to operate in a serial interface mode; and
   a plurality of parallel interface connections integrated on the substrate and within spaces between sets of the plurality of serial interface connections and structured to operate in a parallel interface mode,
   wherein the serial interface mode and the parallel interface mode provide a dual mode interface to communicate with differentiated packaging technologies.

2. The integrated interface structure of claim 1, wherein the plurality of serial interface connections and the plurality of parallel interface connections are in an alternating arrangement.

3. The integrated interface structure of claim 1, wherein the plurality of serial interface connections are landing pads for solder bumps.

4. The integrated interface structure of claim 3, wherein the plurality of parallel interface connections are landing pads for either solder bumps or pillars.

5. The integrated interface structure of claim 4, wherein the pillars are copper pillars.

6. The integrated interface structure of claim 3, wherein the plurality of parallel interface connections are solder bumps.

7. The integrated interface structure of claim 6, wherein the solder bumps are at an edge of the substrate.

8. The integrated interface structure of claim 1, wherein the substrate is silicon.

9. The integrated interface structure of claim 1, wherein the plurality of parallel interface connections and the plurality of serial interface connections are integrated onto the substrate and structured to accommodate simultaneously integration of 2-dimensional (2D) assemblies, 2.5-dimensional (2.5D) assemblies and 3-dimensional (3D) assemblies.

10. The integrated interface structure of claim 1, wherein the plurality of serial interface connections are structured to connect modules provided on different substrates.

11. The integrated interface structure of claim 10, wherein the plurality of parallel interface connections are structured to connect modules provided on a same substrate.

12. The integrated interface structure of claim 11, wherein
   the spaces between the sets of the plurality of serial interface connections are an unused chip space, and
   the plurality of parallel interface connections at least one of: accommodate parallel dataconverter interfaces with approximately 1 mm chip edge; redistribute approximately 1 mm pitches flexible C4 pitch; accommodate fine lines and spaces while improving Gbps/mm of C4 space; and stacked memory to replace external components and on-die memory cell.

13. An interposer comprising:
   a substrate; and
   a plurality of serial interface connections integrated on the substrate and alternating with a plurality of parallel interface connections integrated on the substrate in a mixed interface mode structured to communicate in serial or parallel signaling, wherein
   the plurality of serial interface connections are structured to serially connect modules provided on different substrates, and
   the plurality of parallel interface connections are structured to connect, in parallel, modules provided on a same substrate.

14. The interposer of claim 13, wherein the plurality of serial interface connections are landing pads.

15. The interposer of claim 14, wherein the plurality of parallel interface connections are copper pillars.

16. The interposer of claim 14, wherein the plurality of parallel interface connections are solder bumps.

17. The interposer of claim 16, wherein the solder bumps are at an edge of the substrate.

18. The interposer of claim 13, wherein the plurality of parallel interface connections and the plurality of serial interface connections are structured to accommodate simultaneously integration of 2-dimensional (2D) assemblies, 2.5-dimensional (2.5D) assemblies and 3-dimensional (3D) assemblies.

19. An interposer comprising:
   a substrate;
   a plurality of serial interface connections integrated on the substrate which are structured to serially connect modules on different substrates; and
   a plurality of parallel interface connections integrated on the substrate and arranged in an alternating arrangement within spaces formed between the plurality of serial interface connections, and structured to connect, in parallel, components on the substrate, wherein
   the plurality of parallel interface connections and the plurality of serial interface connections are structured in a dual mode interface to communicate in serial and parallel signaling to accommodate simultaneously integration of 2-dimensional (2D) assemblies, 2.5-dimensional (2.5D) assemblies and 3-dimensional (3D) assemblies.

20. The interposer of claim 19, wherein:

the plurality of serial interface connections are landing pads; and the plurality of parallel interface connections are copper pillars.

\* \* \* \* \*